US012710485B2

(12) United States Patent
Taylor et al.

(10) Patent No.: US 12,710,485 B2
(45) Date of Patent: Aug. 18, 2026

(54) MONITORING TECHNOLOGY FOR ACTIVE OPTICAL COMPONENTS

(71) Applicant: NORTECH SYSTEMS, INC., Maple Grove, MN (US)

(72) Inventors: Jerome D. Taylor, Prior Lake, MN (US); Scott Blanc, Bemidji, MN (US); Carl Snyder, Bloomington, MN (US); Brandon Lee Magnan, Crystal, MN (US)

(73) Assignee: NORTECH SYSTEMS, INC., Maple Grove, MN (US)

( * ) Notice: Subject to any disclaimer, the term of this patent is extended or adjusted under 35 U.S.C. 154(b) by 0 days.

(21) Appl. No.: 19/229,609

(22) Filed: Jun. 5, 2025

(65) Prior Publication Data

US 2025/0298093 A1 Sep. 25, 2025

Related U.S. Application Data

(63) Continuation of application No. 18/835,082, filed as application No. PCT/US2023/012319 on Feb. 3, 2023.

(Continued)

(51) Int. Cl.
*G01R 31/67* (2020.01)
*G01R 31/69* (2020.01)

(52) U.S. Cl.
CPC ............. *G01R 31/67* (2020.01); *G01R 31/69* (2020.01)

(58) Field of Classification Search
CPC ........ G01R 31/28; G01R 31/67; G01R 31/69; G01R 23/02; G06F 1/04; G06F 1/24; H04B 17/15
See application file for complete search history.

(56) References Cited

U.S. PATENT DOCUMENTS 6,021,501 A 2/2000 Shay
2005/0223208 A1 10/2005 Moran et al.

(Continued)

FOREIGN PATENT DOCUMENTS

WO WO2021046397 A1 3/2021

OTHER PUBLICATIONS

International Search Report and Written Opinion for International Application No. PCT/US2023/012319, mailed Jul. 17, 2023, 11 pages.

(Continued)

*Primary Examiner* — Son T Le
(74) *Attorney, Agent, or Firm* — Morgan, Lewis & Bockius LLP

(57) ABSTRACT

A diagnostic monitoring device contains a diagnostic monitor circuit configured to monitor analog diagnostic monitoring information, and configured to convert the analog diagnostic monitoring information to digital diagnostic monitoring information, the diagnostic monitor circuit comprising a first clock or a first oscillator. The diagnostic monitoring device further contains a microcontroller comprising a register map, wherein the microcontroller is configured to receive the digital diagnostic monitoring information, store the digital diagnostic monitoring information in the register map, and provide a clock disable command to the diagnostic monitor circuit. The microcontroller further comprises a communications link for communicating with an external system external to the diagnostic monitoring device. The diagnostic monitor circuit is configured to receive a clock disable command from the microcontroller, and in response to receiving the clock disable command, the diagnostic monitor circuit is configured to disable the first clock or the first oscillator.

8 Claims, 11 Drawing Sheets

Related U.S. Application Data

(60) Provisional application No. 63/267,527, filed on Feb. 3, 2022.

(56) References Cited

U.S. PATENT DOCUMENTS

| | | | |
|---|---|---|---|
| 2009/0226166 | A1 | 9/2009 | Aronson et al. |
| 2013/0077968 | A1 | 3/2013 | Yang |
| 2016/0223768 | A1 | 8/2016 | Logan et al. |
| 2018/0284373 | A1 | 10/2018 | Lin et al. |
| 2020/0003973 | A1 | 1/2020 | Li et al. |
| 2020/0174205 | A1 | 6/2020 | Kubo et al. |
| 2021/0182441 | A1* | 6/2021 | Haramaty ............... G06F 21/73 |
| 2021/0327656 | A1 | 10/2021 | Henke et al. |

OTHER PUBLICATIONS

International Search Report and Written Opinion for International Patent Application No. PCT/US2022/013938, mailed Apr. 26, 2022, 8 pages.

Partial Supplementary European Search Report in Application No. 23750224.0, dated Dec. 22, 2025, 17 pages.

* cited by examiner

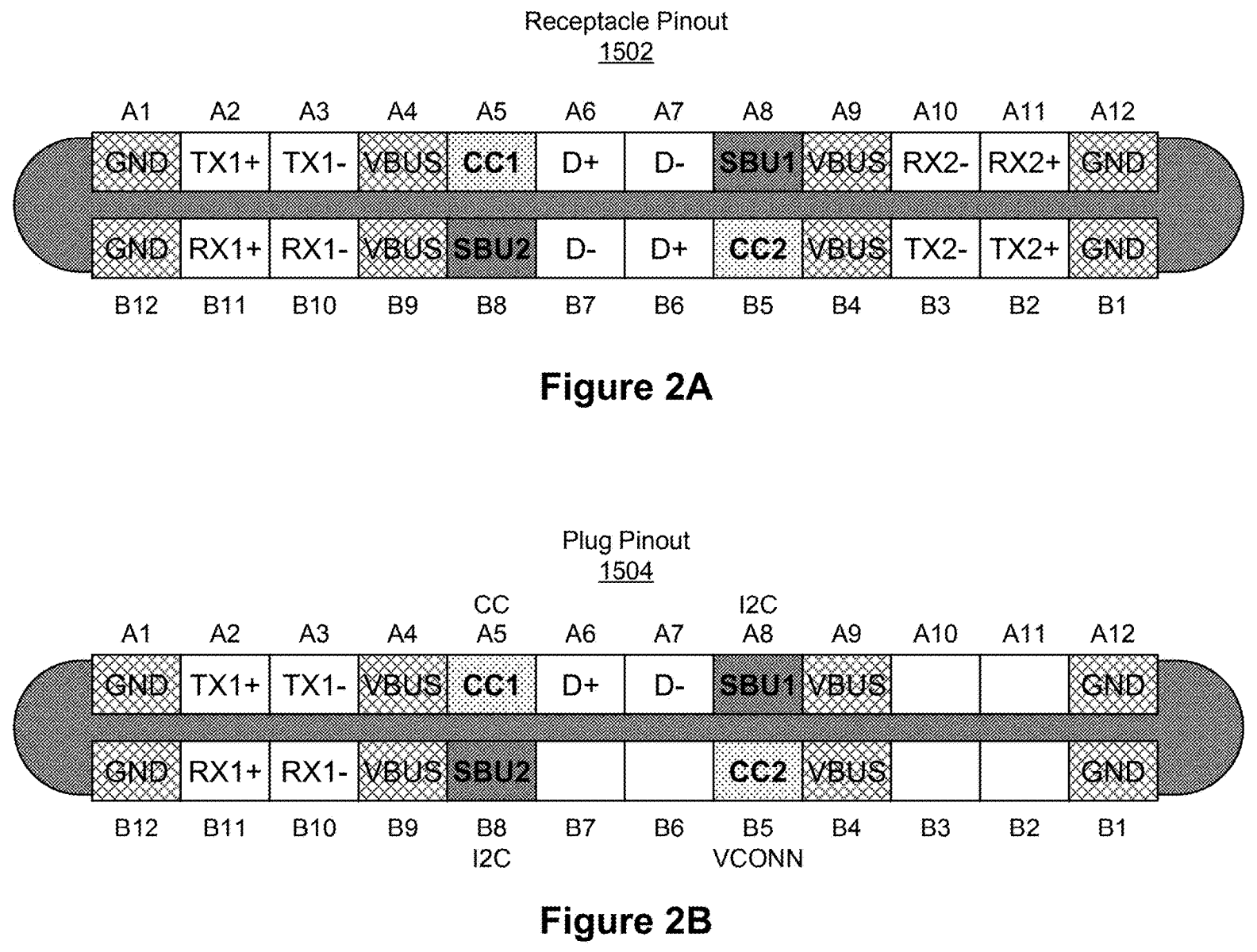

Receptacle Pinout
1502

| A1 | A2 | A3 | A4 | A5 | A6 | A7 | A8 | A9 | A10 | A11 | A12 |
|---|---|---|---|---|---|---|---|---|---|---|---|
| GND | TX1+ | TX1- | VBUS | CC1 | D+ | D- | SBU1 | VBUS | RX2- | RX2+ | GND |
| GND | RX1+ | RX1- | VBUS | SBU2 | D- | D+ | CC2 | VBUS | TX2- | TX2+ | GND |
| B12 | B11 | B10 | B9 | B8 | B7 | B6 | B5 | B4 | B3 | B2 | B1 |

Figure 2A

Plug Pinout
1504

CC
I2C

| A1 | A2 | A3 | A4 | A5 | A6 | A7 | A8 | A9 | A10 | A11 | A12 |
|---|---|---|---|---|---|---|---|---|---|---|---|
| GND | TX1+ | TX1- | VBUS | CC1 | D+ | D- | SBU1 | VBUS | | | GND |
| GND | RX1+ | RX1- | VBUS | SBU2 | | | CC2 | VBUS | | | GND |
| B12 | B11 | B10 | B9 | B8 | B7 | B6 | B5 | B4 | B3 | B2 | B1 |

I2C
VCONN

Figure 2B

MONITORING TECHNOLOGY FOR ACTIVE OPTICAL COMPONENTS

RELATED PATENTS AND PRIORITY

This application is a continuation of U.S. patent application Ser. No. 18/835,082, filed Aug. 1, 2024, which is a 371 National Entry of International Application No. PCT/US2023/012319, filed Feb. 3, 2023, which claims the benefit of U.S. Provisional Application No. 63/267,527, filed Feb. 3, 2022. This application is also related to PCT International Application No. PCT/US2022/013938, filed Jan. 26, 2022, which claims the benefit of U.S. Provisional Application No. 63/141,866, filed Jan. 26, 2021, all of which are hereby incorporated herein by reference in their entirety.

TECHNICAL FIELD

The present disclosure is generally related to the field of active optical products (e.g., cabling systems and assemblies, etc.) and, more particularly, to active optical products that include or provide an interface for digital diagnostics and maintenance of optical systems.

BACKGROUND

Data rates have increased between modules, at least in the avionics field, due to a desire to provide for high-definition digital video for in-flight entertainment systems, cockpit displays, AFDX (Avionics Full Duplex Switched Ethernet) interconnect protocol and the like. Accordingly, avionics systems and aircraft manufacturers hope to take advantage of the extremely high bandwidth and light weight, ease of routing, and immunity to electromagnetic interference (EMI) offered by the optical fiber transport medium. There is a need, therefore, for avionics rack assemblies and associated modules to accommodate fiber optic connections, e.g., with active optical cable (AOC) components, therebetween. One approach that has been taken on the module side in such systems employs an optical converter component inside of the module, which is mounted on a (fixed or flexible) printed circuit board. The foregoing example of avionics modules is intended to be non-limiting, and it is noted that the problems described herein with realizing fiber-optic interfaces in electronics modules pertain to application in many other fields, and the usefulness of the embodiments described herein is therefore not limited to the avionics industry.

Digital Diagnostic Monitoring Interface (DDMI) systems monitor certain metrics of the cable and the system in which is it used, but such systems can introduce noise, may lack a method to predict the failure of the cable in the future, and may employ ferrous materials that are magnetic, requiring some of the circuitry to be offloaded to a printed circuit board that is external to the cable.

USB-C connectors are reversible, in that a USB-C connector on the end of a cable can be plugged into a USB-C receptacle on a device, at more than one orientation. When different types of signals are sent on different pins within the connector, it may not be possible to detect the orientation of the USB-C connector relative to the receptacle.

High quality cabling with DDMI is costly, and cables can sometimes be difficult to replace, and down time while a cable needs replacement can take an important machine out of productive use. Dynamically updating statistical modeling is absent from conventional cables. Instead, such modeling typically requires costly modeling systems that are external to the cable.

SUMMARY

In one embodiment, a diagnostic monitoring device is disclosed. The diagnostic monitoring device contains a diagnostic monitor circuit configured to monitor analog diagnostic monitoring information, and configured to convert the analog diagnostic monitoring information to digital diagnostic monitoring information, the diagnostic monitor circuit comprising at least one of a first clock and a first oscillator. The diagnostic monitoring device further contains a microcontroller comprising a register map, wherein the microcontroller is configured to receive the digital diagnostic monitoring information, store the digital diagnostic monitoring information in the register map, and provide a clock disable command to the diagnostic monitor circuit. The microcontroller further comprises a communications link for communicating with an external system external to the diagnostic monitoring device. The diagnostic monitor circuit is configured to receive a clock disable command from the microcontroller, and in response to receiving the clock disable command, the diagnostic monitor circuit is configured to disable at least one of the first clock and the first oscillator.

In one embodiment a diagnostic monitoring device is disclosed. The diagnostic monitoring device contains a diagnostic monitor circuit configured to monitor one or more electrical characteristics of an associated device based on diagnostic monitoring information received at the diagnostic monitor circuit. The diagnostic monitor circuit contains a first clock or a first oscillator, and a microcontroller configured to receive processed diagnostic monitoring information from the diagnostic monitor circuit and provide a clock disable signal to the diagnostic monitor circuit. The diagnostic monitor circuit also contains a second clock, wherein the diagnostic monitor circuit is configured to receive a clock disable command, and disable one or more of the first clock, the first oscillator, and the second clock based on the clock disable command.

In one embodiment, a transceiver module is disclosed. The transceiver module contains a diagnostic monitor circuit configured to monitor one or more electrical characteristics of an associated device based on diagnostic monitoring information received at the diagnostic monitor circuit, and a microcontroller containing a register map. The microcontroller is configured to receive the diagnostic monitoring information. The microcontroller also contains a first internal bus and a second internal bus that have opposite orientations. The transceiver also contains a connector configured to be coupled to the external system via a receptacle capable of receiving the connector in more than one orientation. The connector has a first pin in a first row of pins, and a second pin in a second row of pins, the second row of pins being opposite the first row of pins, the first pin being located a number of pins away from the beginning of the first row, and the second pin being located the same number of pins away from the beginning of the second row, wherein the beginning of the first row and the beginning of the second row are on opposite ends of the connector. The transceiver also contains an external bus coupled to the connector, and an orientation detection module. The orientation detection module is configured to detect whether the data information is being received on the first pin or the second pin, activate the first internal bus if the data information is being received on the first pin, activate the second internal bus if the data information is being received on the second pin, and operationally couple the activated first internal bus or the activated second internal bus to the external bus.

In one embodiment, a cable comprising a diagnostic monitoring device is disclosed. The diagnostic monitoring device is configured to collect diagnostic monitoring information relating to the cable, wherein the diagnostic monitoring information comprises an electrical characteristic of a diagnostic information type of the cable, associate and store the diagnostic monitoring information with an alert criteria based on the diagnostic information type, and determine whether the electrical characteristic meets the alert criteria for the diagnostic information type. In response to a determination that the electrical characteristic meets the alert criteria, the diagnostic monitoring device is configured to generate an alert signal; and transmit the alert signal to one or more output pins of the cable.

BRIEF DESCRIPTION OF THE DRAWINGS

Exemplary embodiments are illustrated in referenced figures of the drawings. It is intended that the embodiments and figures disclosed herein are to be illustrative rather than limiting.

FIGS. 2A-2B are block diagrams of example pinouts for a receptacle and an AOC plug configured to convey DDMI data in accordance with some implementations.

DETAILED DESCRIPTION

Figure 1:
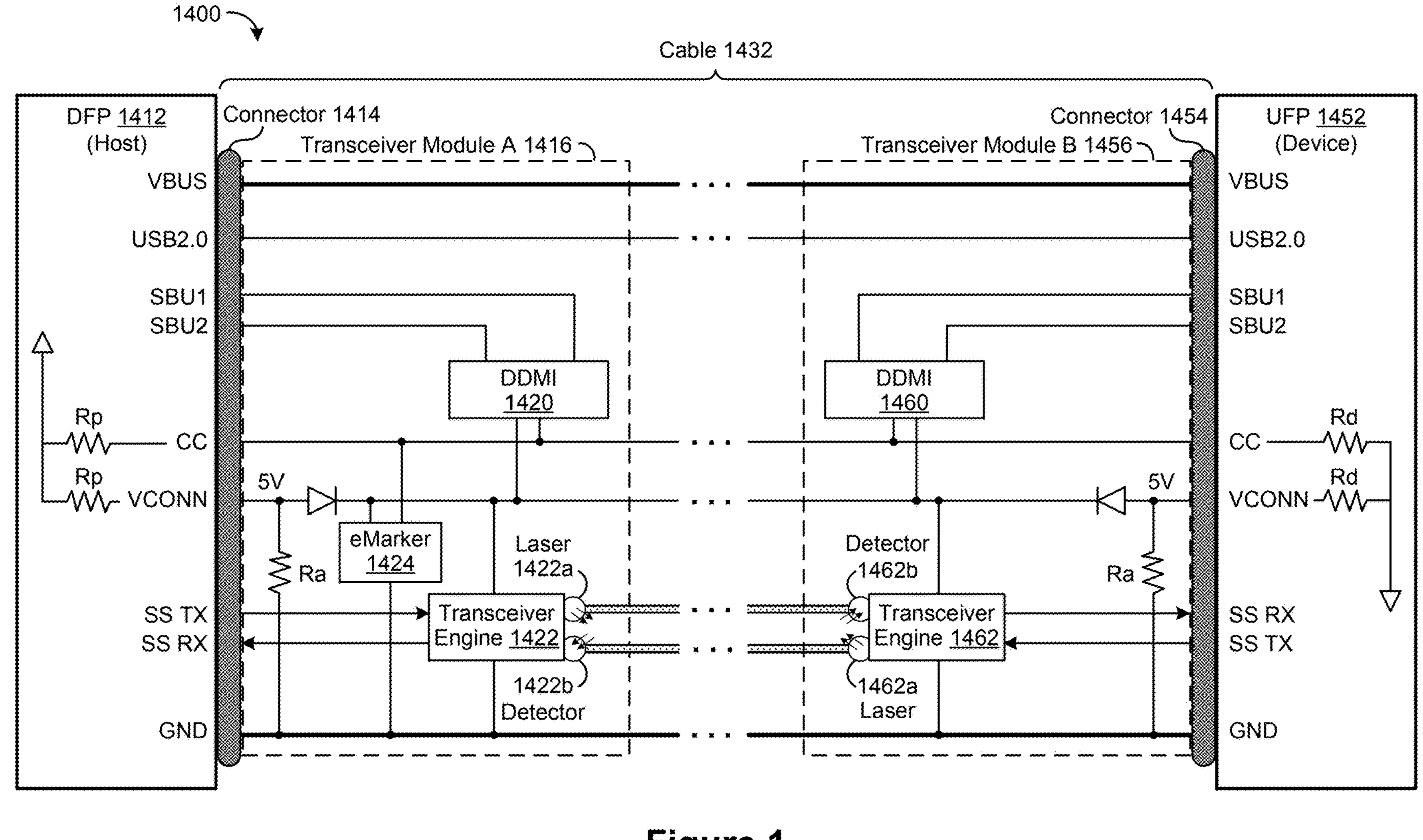
FIG. 1 is a block diagram of an AOC assembly with embedded DDMI in accordance with some implementations.

The following description is presented to enable one of ordinary skill in the art to make and use the invention and is provided in the context of a patent application and its requirements. Various modifications to the described embodiments will be readily apparent to those skilled in the art and the generic principles taught herein may be applied to other embodiments. Thus, the present disclosure is not intended to be limited to the embodiment shown, but is to be accorded the widest scope consistent with the principles and features described herein including modifications and equivalents, as defined within the scope of the appended claims. It is noted that the drawings are not to scale and are diagrammatic in nature in a way that is thought to best illustrate features of interest. Descriptive terminology may be used with respect to these descriptions, however, this terminology has been adopted with the intent of facilitating the reader's understanding and is not intended as being limiting. Further, the figures are not to scale for purposes of illustrative clarity.

The active optical cable (AOC) apparatuses and systems described in this disclosure include a nonmagnetic pluggable active optical transceiver product. Such a AOC product may include opto-electronic converter modules integrated with configurable cabling. Further, a AOC product maintains engagement of the optical interface and features removable insertion features that facilitate engagement, indexing and alignment with the mating interconnecting devices. In various embodiments, the AOC product includes electronics-embedded optical components designed to convert electrical to optical signals or vice-versa. Various components of the AOC product may include metal components, one or more of which may have a magnetic permeability value at which the respective metal components are considered non-magnetic. Further, the AOC product may include or provide a digital interface that allows real time access to device operating parameters, and includes a system of alarm and warning flags which alerts the host system when operating parameters are outside of normal operating range (factory set).

In some embodiments, one or more components described herein may be or include a metal. Any such metal components may be composed of a base metal layer, subplating metal layer and final plating metal layer. The material of the base metal layer, subplating metal layer and final plating metal layer may be selected from the list comprising or consisting of non-magnetic metals: aluminum, silver, tin, phosphor bronze, brass, copper, gold, lead, titanium, silicon bronze, cobalt-chromium, beryllium copper, non-magnetic stainless steel and various alloy combinations thereof. In some embodiments, any metal components may have a magnetic permeability that is non-magnetic (e.g., a value of less than 1.0 B/H (or less than about)). Further, nonmagnetic components may be treated using passivation processes to create a microcoating protection against corrosion. AOC assembly may employ a number of PCB technologies applicable to creating nonmagnetic solutions including but not limited to hot air surface level (HASL), electroless nickel immersion gold (ENIG), copper palladium immersion gold (CPIG), immersion silver (IS) and organic solder preservation (OSP) processes.

An AOC product or assembly as described in this disclosure may be deployed in an electronic rack assembly used in the avionics field. An electronic rack assembly can define one or more positions each of which is configured for receiving a module. The rack assembly can include a connection back plane such that each module can include a complementary connection arrangement that blind-mates to the connection back plane when each module is installed. In this way, a large number of interface connections can simultaneously be made or broken such that each module can be conveniently installed and/or replaced.

Active optical cable (AOC) is a cabling technology that accepts the same electrical inputs as a traditional copper cable, but uses optical fiber between the connectors. AOC uses electrical-to-optical and optical-to-electrical conversion on the cable ends to improve speed and distance performance of the cable without sacrificing compatibility with standard electrical interfaces. The conversion between electrical and optical signals is implemented by transceiver modules in the cable ends. Each transceiver module includes a transceiver engine that both (i) converts electrical signals received from an external device to optical signals for transmission through the cable using light-emitting technology (e.g., vertical-cavity surface-emitting lasers (VCSEL)), and (ii) converts optical signals received through the cable using a detector to electrical signals for conveying to an external device.

In some embodiments, an AOC assembly includes an enhanced Digital Diagnostics Monitoring Interface ("DDMI"), which employs a general purpose optical transceiver module or converter. The interface may be operationally connected to an opto-electronic converter and/or a circuit board assembly. The interface allows real time access to device operating parameters, and includes a system of alarm and warning flags which alerts the host system when operating parameters are outside of normal operating range, which may in some implementations be factory set. The interface may utilize proprietary elements such as embedded microcontroller and non-volatile memory and discrete electrical components to implement diagnostics, reporting, signal detection and status information. The interface may further allow for subsystem adjustments, such as adjustable bias current control, based on reported real-time/run-time values including but not limited to: RX power monitoring, TX power monitoring, bias current monitoring, supply voltage monitoring and temperature monitoring. The reporting mechanism may be designed for in-band and/or out-of-band (e.g. sideband) usage models. The transceiver generates this diagnostic data by digitization of internal analog signals. One design goal will be to provide alarms for failed systems and real time stats for predictive maintenance.

Modern transceiver modules support standard digital diagnostics monitoring (DDM) functions. This feature is also known as digital optical monitoring (DOM). This capability allows monitoring of transceiver operating parameters in real time using DDMI. Parameters that may be monitored using DDMI include, but are not limited to, optical output power, optical input power, temperature, laser bias current, transceiver supply voltage, soft controls, and so forth. This information is typically made available via DDMI, which allows end users to display diagnostics data and alarms for optical fiber transceivers and can be used to diagnose why a transceiver is not working.

While DDMI has traditionally been implemented outside of the cable, DDMI may be embedded within the AOC assembly. Embedded DDMI provides real time access to diagnostic data in the cable itself, which can be more efficient than requiring external circuitry for performing diagnostics. However, depending on the application in which the cable is being used (e.g., in certain industrial applications with sensitive components), embedded DDMI circuitry may cause increased electromagnetic interference (EMI), thereby reducing the signal-to-noise (SNR) ratio. A decreased SNR can result in artifacts when AOC cabling is used in imaging applications such as Magnetic Resonance Imaging (MRI) machines. One way to address decreased SNR is to shorten the length of the cabling that can be used in the system. However, shorter cables may inconvenient or even impossible to use in certain scenarios.

Figure 3:
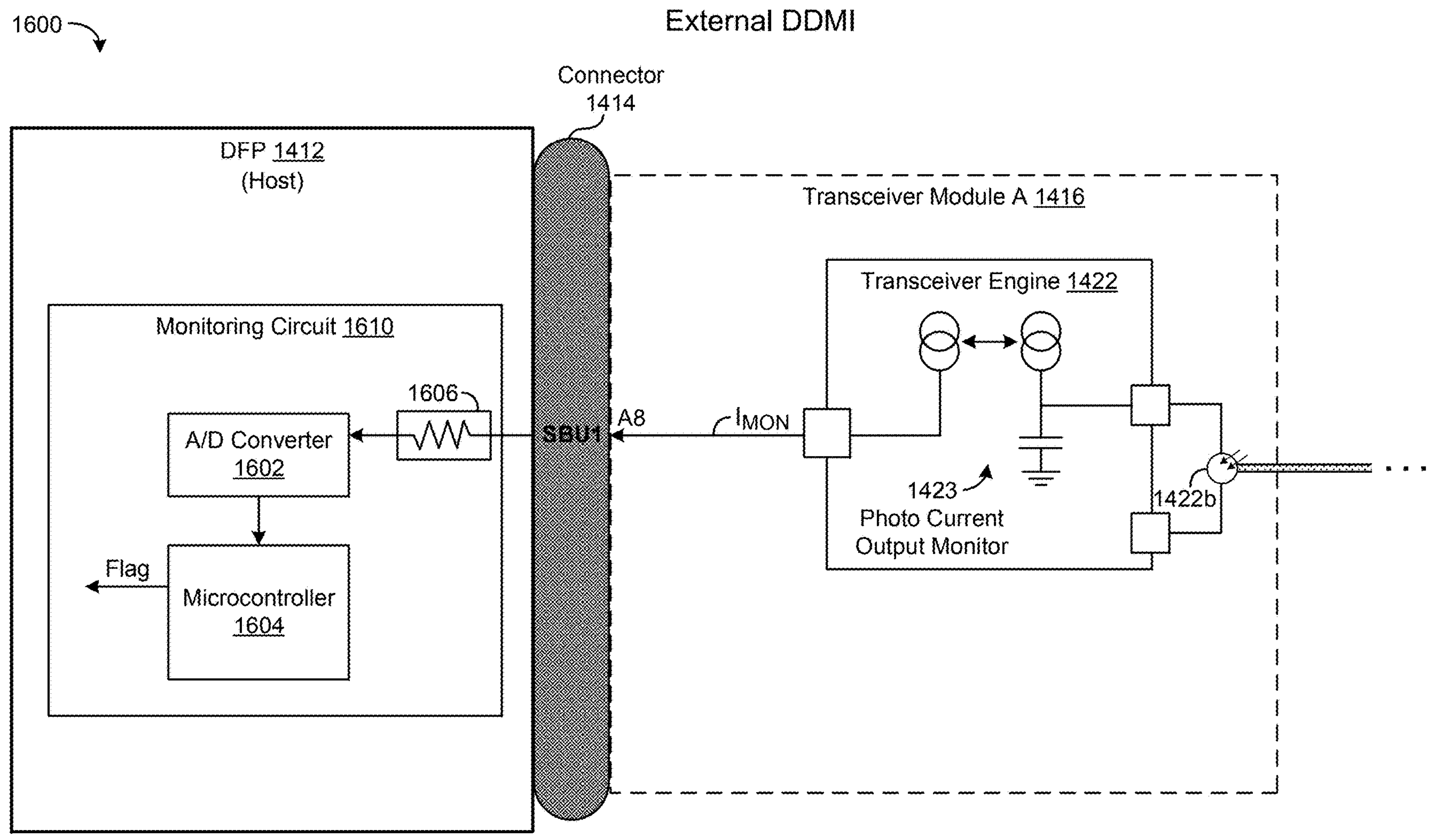
FIG. 3 is a block diagram of an AOC diagnostic monitoring system with external DDMI in accordance with some implementations.
Figure 4A:
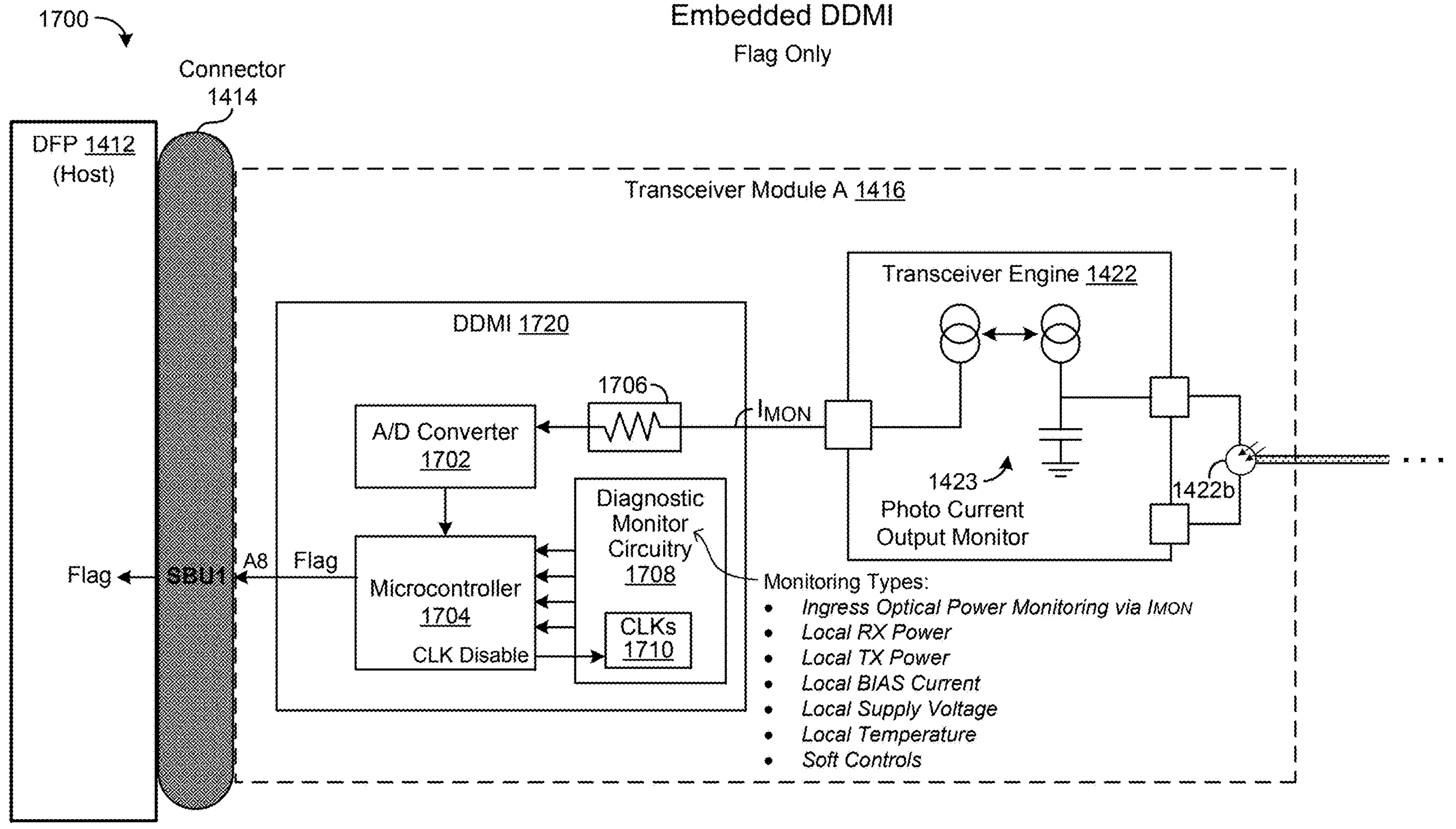
FIG. 4A is a block diagram of an AOC diagnostic monitoring system with embedded DDMI, configured to convey DDMI flags using a single connector pin in accordance with some implementations.
Figure 4B:
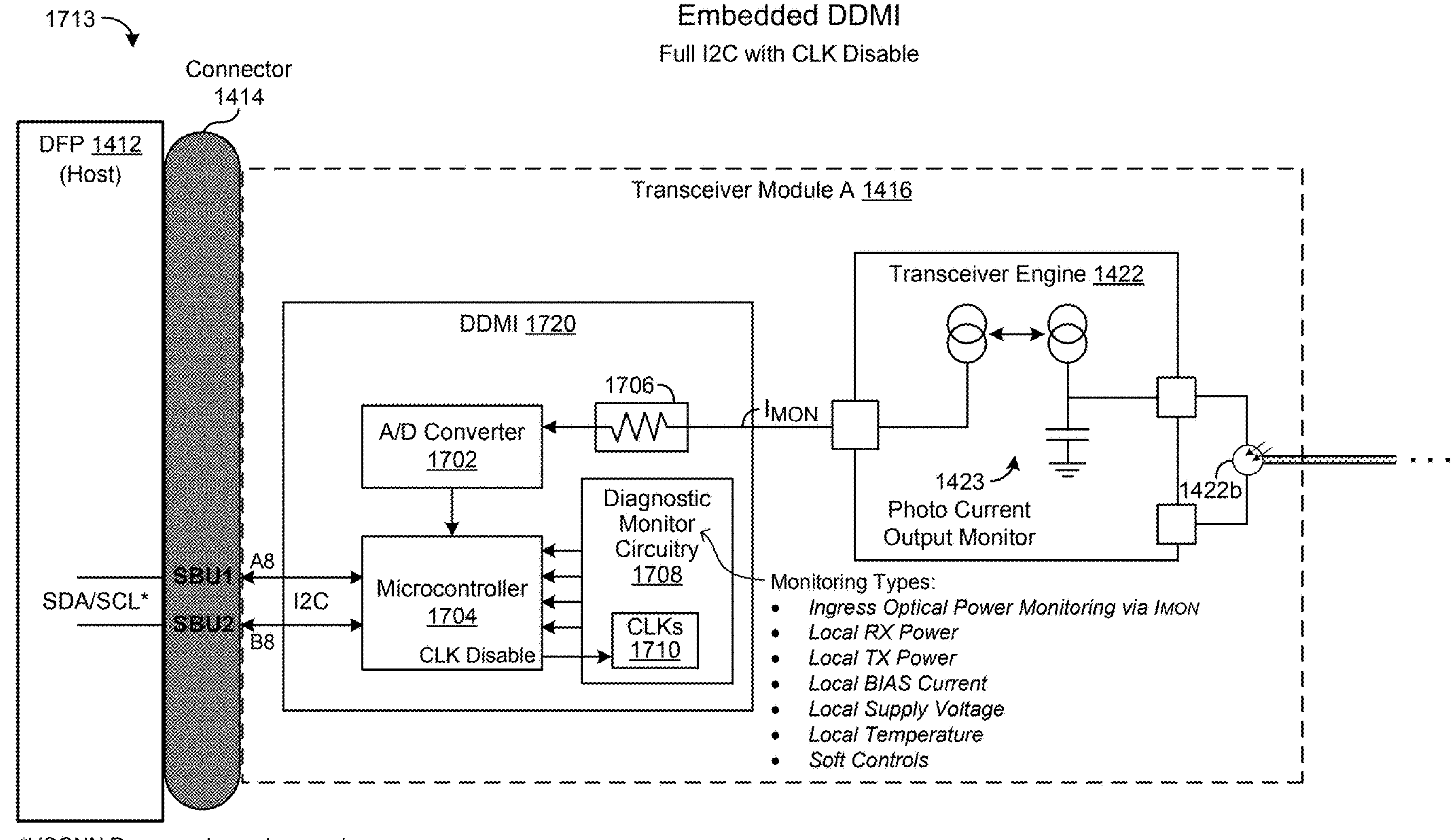
FIG. 4B is a block diagram of an AOC diagnostic monitoring system with embedded DDMI, configured to convey DDMI data using two connector pins implementing I2C in an orientation-agnostic manner in accordance with some implementations.
Figure 4C:
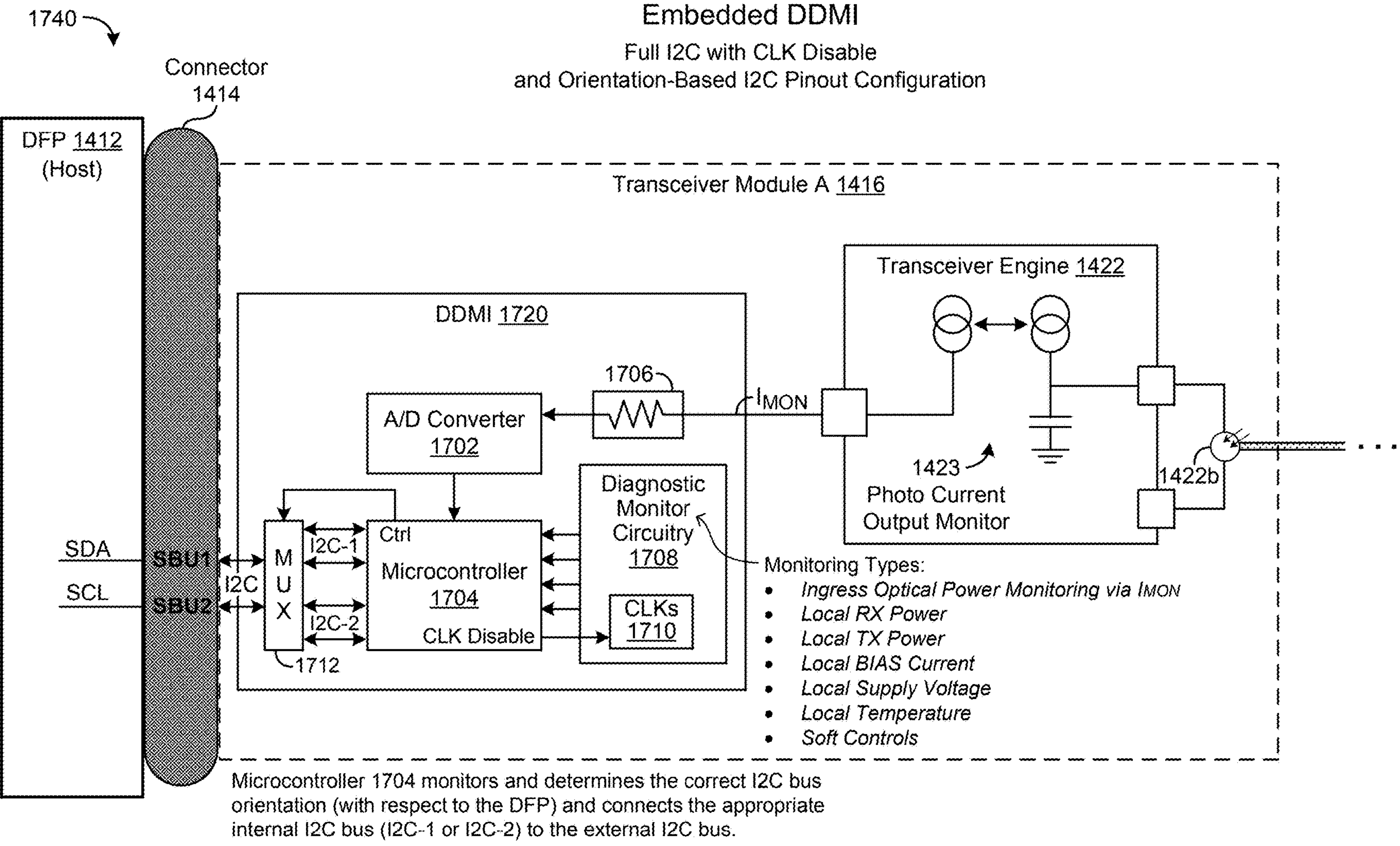
FIG. 4C is a block diagram of an AOC diagnostic monitoring system with embedded DDMI, configured to convey DDMI data using two connector pins implementing I2C in an orientation-specific manner in accordance with some implementations.
Figure 5A:
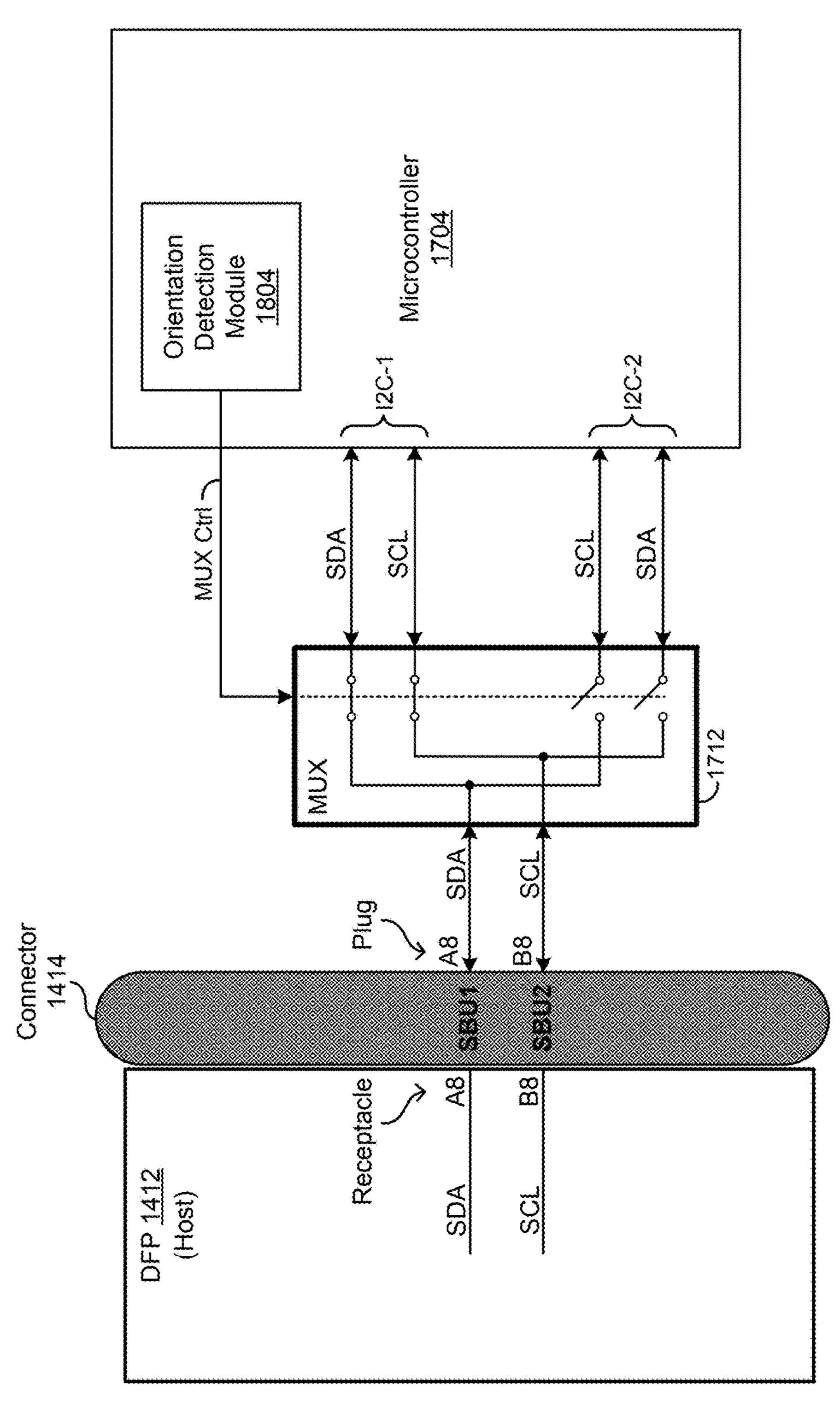
FIGS. 5A-5B are block diagrams of multiplexing circuitry for the AOC diagnostic monitoring system described with reference to FIG. 4C in accordance with some implementations.
Figure 5B:
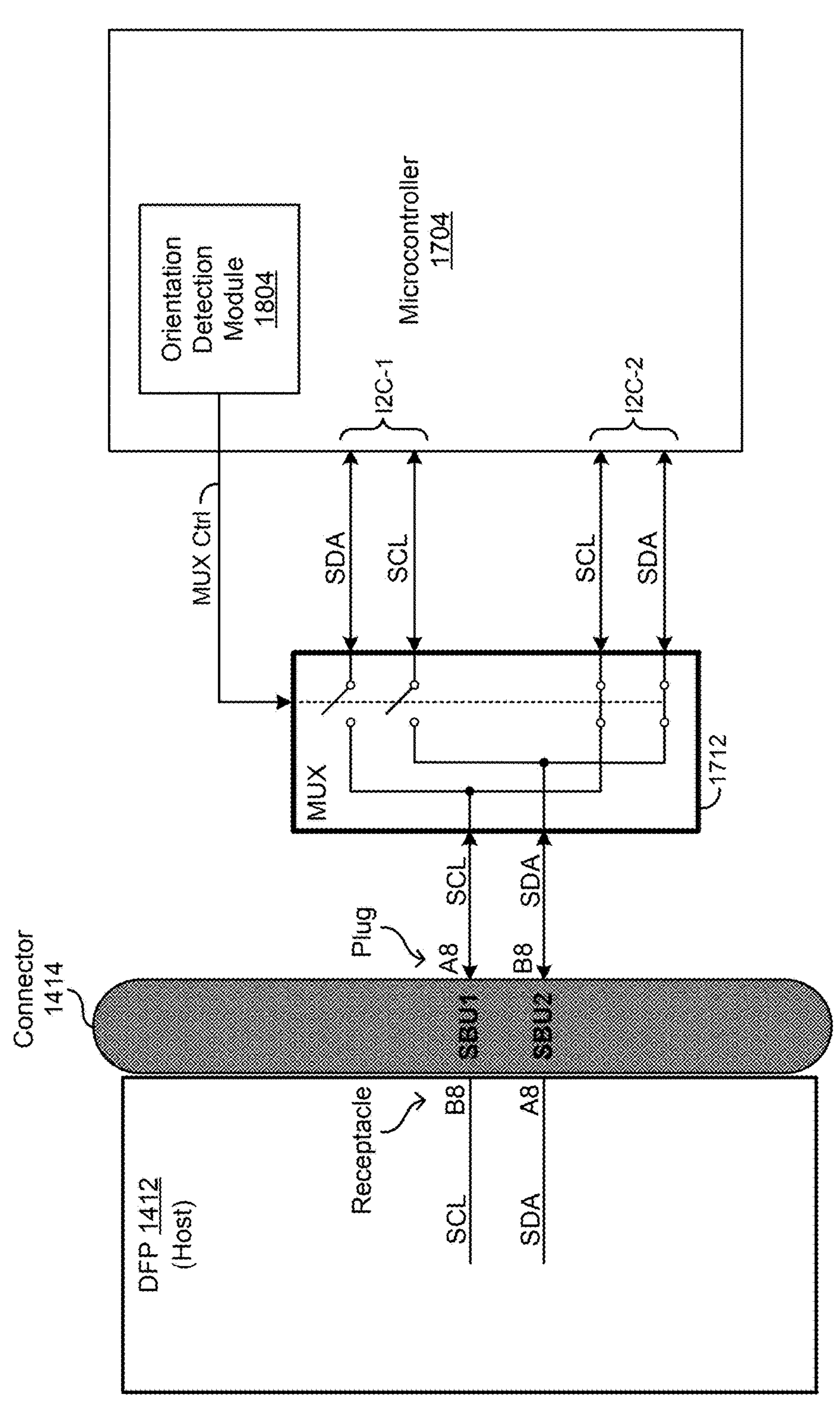

The present discussion covers several implementations of an AOC assembly with embedded DDMI (FIG. 1), example pinouts for a receptacle and an AOC plug configured to convey DDMI data (FIGS. 2A-2B), an AOC transceiver implementation using external DDMI (FIG. 3), several AOC transceiver implementations with embedded DDMI, including an implementation communicating a DDMI flags using a single connector pin (FIG. 4A), an implementation communicating DDMI data using two connector pins implementing I2C in an orientation-agnostic manner (FIG. 4B), and an implementation communicating DDMI data using two connector pins implementing I2C in an orientation-specific manner (FIGS. 4C and 5A-5B). In addition, the implementations described in FIGS. 4B and 4C include DDMI clock disabling features in order to address the EMI and reduced SNR caused by the DDMI circuitry.

The following discussion provides additional details regarding a plurality of implementations of AOC assemblies having transceiver modules with different combinations of (i) embedded DDMI circuitry, (ii) configurable DDMI clock disabling, (iii) orientation-agnostic I2C communications for embedded DDMI data, and (iv) orientation-specific I2C communications for embedded DDMI data.

Turning now to the figures wherein like components may be designated by like reference numbers throughout the various figures, attention is immediately directed to FIG. 1, which is a block diagram of an AOC assembly 1400 with embedded DDMI in accordance with some implementations. AOC assembly 1400 includes a cable 1432 with active optical components (e.g., transceiver engines 1422 and 1462), diagnostic circuitry (e.g., DDMI 1420 and 1460), and connectors 1414 and 1456 (also referred to as plugs) on each end. A first connector 1414 is configured to convey power and data signals to and from the cable 1432 to a downstream facing port (DFP) 1412 of a host. A second connector 1454 is configured to convey power and data signals to and from the cable 1432 to an upstream facing port (UFP) 1412 of a device (e.g., a device that functions as a peripheral to the host). Both ends of the cable 1432 are interchangeable, having the same pinout, transceiver circuitry, and DDMI circuitry.

Cable 1432 includes a transceiver module on each end. Transceiver module A (labeled 1416 in the figure) and transceiver module B (labeled 1456 in the figure) include analogous components. As such, for purposes of brevity and so as not to obscure more pertinent aspects of the disclosure, the following discussion only describes transceiver module A (1416) in detail.

Transceiver module 1416 includes embedded diagnostic circuitry DDMI 1420, a transceiver engine 1422, and eMarker module 1424 (e.g., a chip that records, or marks, the cable's speed and highest current). DDMI 1420 is described in more detail below with reference to FIGS. 4A-4C. In some implementations, DDMI 1420 is configured to convey diagnostic data and communicate with DFP 1412 via sideband buses SBU1 and/or SBU2.

The transceiver engines includes transmission (TX) and receiving (RX) circuitry configured to convert signals between electrical and optical formats. The transmission circuitry (1422*a* and 1462*a*) may include any electronic optical signal transmitter, such as a laser (e.g., a vertical-cavity surface-emitting laser (VCSEL)) or an LED. A VCSEL is a type of laser diode that emits light from its surface. A VCSEL's circular beam is easy to couple with fiber. The receiving circuitry (1422*b* and 1462*b*) may include any electronic optical signal detector configured to detect the optical data emitted by the transmission circuitry on the other side of the cable.

Thus, transceiver engine 1422 is configured to convert electrical data received from DFP 1412 to optical data and transmit the optical data via laser 1422_a_ and a fiber cable to transceiver engine 1462 at the other end of the cable, and transceiver engine 1462 is configured to receive the optical data at detector 1462_b_ and convert the optical data back to electrical data for conveying to UFP 1452. Transceiver engine 1462 is further configured to convert electrical data received from UFP 1452 to optical data and transmit the optical data via laser 1462_a_ and a fiber cable to transceiver engine 1422 at the other end of the cable, and transceiver engine 1422 is further configured to receive the optical data at detector 1422_b_ and convert the optical data back to electrical data for conveying to DFP 1412.

Cable 1432 is configured to convey power VBUS and GND (power and ground rails). These power rails are sometimes referred to as power delivery (PD) buses, and may be optimized for high power applications (e.g., requiring up to 100 watts or more). Cable 1432 is configured to convey high speed optical data via SS TX and SS RX internal data bases (by converting the data to optical signals and conveying them using optical fibers as described above). Cable 1432 may optionally be configured to convey low speed data via an internal low-speed data bus (e.g., a USB2.0 data bus). In addition, cable 1432 may be configured to convey diagnostic data and communicate with DFP 1412 and UPF 1452 via sideband buses SBU1 and SBU2.

The electronic components in the transceiver modules 1416 and 1456 (e.g., DDMI 1420 and transceiver engine 1422) are powered via an internal connector power bus VCONN. In some implementations, DFP 1412 may power the internal electronics at both ends of the cable using the internal connector power bus VCONN. In this scenario, since the host powers both ends of the cable, cable 1432 does not need to wait for a peripheral device to provide power. In some implementations, VCONN may power the internal electronic components of cable 1432 using 5V (alternative implementations may require more or less voltage).

Cable 1432 includes a communication channel CC for initially establishing a link between DFP 1412 and UFP 1452. When the cable 1432 is plugged into devices DFP 1412 and UFP 1452, the devices use communication channel CC to establish an end-to-end link on the cable.

Cable 1432 may be configured to determine cable orientation (e.g., which end is plugged into the DFP, and which end is plugged into the UFP) by sensing voltage on resistor divider circuits on the CC and VCONN lines. Specifically, host devices (e.g., DFP 1412) may include pull-up resistors Rp on the CC and VCONN lines, and peripheral devices (e.g., UFP 1452) may include pull-down resistors Rd on the CC and VCONN lines. Thus, if a transceiver module senses voltage at the connector (e.g., 1414) above a threshold, then the transceiver module may determine that it is connected to a host (e.g., DFP 1412). On the other hand, if a transceiver module senses voltage at the connector (e.g., 1454) below a threshold, then the transceiver module may determine that it is connected to a peripheral (e.g., UFP 1452).

Cable 1432 may be configured to determine connector orientation (e.g., which end of the connector lines up with which end of the port receptacle of the host or peripheral device) by comparing voltages on the resistor divider circuits on the CC and VCONN lines. Specifically, cable 1432 may include an internal pull-down resistor Ra on the VCONN line. Since resistors Ra and Rd provide more resistance to ground than only resistor Rd, the VCONN voltage at the connector will be slightly higher than the CC voltage at the connector. Thus, by determining which voltage is higher, a transceiver module (e.g., 1416) may determine in which orientation the connector (e.g., 1414) is plugged into a device (e.g., DFP 1412).

FIGS. 2A-2B are block diagrams of example pinouts for a receptacle and an AOC plug configured to convey DDMI data in accordance with some implementations.

Receptacle pinout 1502 may represent the pinout of a host DFP 1412 receptacle or a device UFP 1452 receptacle. These pinouts correspond to the USB-C standard. While USB-C is provided as an example to describe pertinent aspects of the disclosure, other pinout standards may be implemented, as the concepts described herein may apply equally to any standard that supports active optical communications.

Referring to receptacle pinout 1502, power rails VBUS and GND are provided at pins A1, A4, A9, A12, B1, B4, B9, and B12. High speed data pins are provided at pins A2, A3, A10, A11 and B2, B3, B10, and B11. Low speed data pins are provided at pins A6, A7, B6, and B7, configuration channels are provided at pins A5 and B5. Lastly, sideband channels (which may be customizable depending on the application) are provided at pins A8 and B8. The layout of these pins support reversibility when it comes to plugging in a cable.

Referring to plug pinout 1504, power rails VBUS and GND are provided at pins A1, A4, A9, A12, B1, B4, B9, and B12, which connect to corresponding pins in receptacle pinout 1502. However, high speed data pins are only provided at one end of the cable, at pins A2, A3, B10, and B11. This is to support cable reversibility. Stated another way, either end of a cable may be plugged into a host, and the host and cable will communicate in the same way. Thus, pins A10, A11, B2, and B3 are empty (not connected to electronics inside the cable). For the same reasons, low speed data pins are only provided at pins A6 and A7, with pins B6 and B7 being empty. Sideband channels at pins A8 and B8 (which may be customizable depending on the application) may be configured for I2C communications, as data (SDA) and clock (SCL) lines, described in more detail below with reference to FIGS. 4B-4C. Configuration channels at pins A5 and B5 may be respectively configured as a configuration channel CC and an internal connector power rail VCONN.

As can be seen in FIGS. 2A and 2B, it is important for the electronics in the AOC assembly to determine the orientation of the plug with respect to the receptacle (e.g., whether pin A1 in the plug lines up with pin A1 or pin B1 in the receptacle, whether pin A2 in the plug lines up with pin A2 or B2 in the receptacle, and so forth). For implementations in which the cable is reversible, only one half of the plug can convey high-speed data communications using the internal optical fibers. Further, for implementations in which the sideband channels are used for I2C communications (e.g., for DDMI data and/or clock disable signals) between the host and the cable, it is important for the electronics in the AOC assembly to determine the orientation of the plug with respect to the receptacle so both the host and the cable electronics agree on which sideband pin (SBU1, SBU2) is assigned to I2C data signals (SDA) and which sideband pin is assigned to I2C clock signals (SCL). Further, it is important for the electronics in the AOC assembly to determine the orientation of the plug with respect to the receptacle so both the host and the cable electronics agree which configuration pin (CC1, CC2) is assigned to the configuration channel (CC), and which configuration pin is assigned to the internal connector power bus (VCONN).

FIG. 3 is a block diagram of an AOC diagnostic monitoring system 1600 with external DDMI in accordance with some implementations. System 1600 is an implementation of AOC assembly 1400 with the diagnostic monitoring moved outside of the cable, and instead included in the DFP 1412 as a monitoring circuit 1610.

In system 1600, the cable includes a transceiver module A (1416) as described above, which interfaces with DFP 1412 through connector 1414 as described above. Transceiver module A (1416) includes transceiver engine 1422, which converts signals between electrical and optical forms, transmits and receives the optical signals via fiber, and conveys the signals (in electrical form) to DFP 1412 (e.g., via copper conductor) as described above. FIG. 3 only depicts certain components of transceiver engine 1422 (e.g., receiving circuitry 1422*b*) while leaving out others (e.g., transmitting circuitry 1422*a*) for purposes of brevity and in order to not obscure more pertinent concepts. Transceiver engine 1422 includes a photo current output monitor 1423, which comprises circuitry configured to measure optical power while receiving circuitry 1422*b* receives optical data. Specifically, photo current output monitoring circuitry 1423 senses, at receiving circuitry 1422*b*, the power of the transmitting circuitry 1462*a* (FIG. 1) on the opposite side of the cable. The measured optical power (the power output of the transmitting circuitry on the other end of the cable), or a value corresponding to the measured optical power, is conveyed from transceiver engine 1422 in the form of monitoring current $I_{MON}$.

Transceiver module A (1416) conveys monitoring current IMON to DFP 1412 using a sideband channel (e.g., SBU1, pin A8). Monitoring circuit 1610 receives and analyzes monitoring current $I_{MON}$ in order to determine whether the monitoring current $I_{MON}$ is within acceptable parameters, and by extension, whether the transceiver engine 1422 is performing properly and/or whether there are any issues in general regarding the AOC's ability to transmit optical signals from one end to the other. In some implementations, monitoring circuit 1610 converts monitoring current $I_{MON}$ to a voltage using a resistor 1606 (or any adequate circuitry configured to convert current to voltage), converts the voltage in an analog to digital (A/D) converter 1602 to a digital signal, and sends the digital signal to microcontroller 1604. Microcontroller 1604 is configured to compare (e.g., by settings in a register map) the digital signal (representing monitoring current $I_{MON}$) to predefined thresholds, and output a flag in the event the digital signal is below a minimum threshold and/or above a maximum threshold. In some implementations, the flag is a notification that a monitored signal (e.g., $I_{MON}$) violates one or more thresholds corresponding to normal operation of the AOC. Other circuitry in the DFP 1412 (not shown) may communicate that flag to a user via an output device (e.g., a display) or any other device configured to communicate a message to a user. In alternative implementations, the monitoring current $I_{MON}$ may be processed by microcontroller 1604 as described above, but without first converting $I_{MON}$ to a voltage and/or without converting $I_{MON}$ to a digital signal. In some implementations, the flags transmitted by the microcontroller are used by other applications (either embedded in the AOC or external, such as in the DFP 1412) to perform predictive maintenance analysis (e.g., as described below with reference to FIGS. 6 and 7A-7B).

While system 1600 provides access to diagnostic data (optical power monitoring current $I_{MON}$) associated with the AOC, the diagnostic data requires further processing in an external device (e.g., DFP 1412) to obtain actionable data (e.g., flags) that can be used to efficiently discover and/or diagnose quality issues with the AOC. FIGS. 4A-4C describe implementations of an AOC with the DDMI functionality embedded in the cable itself, thereby providing actionable diagnostic data without requiring the monitoring of raw diagnostic data on an external device as described in FIG. 3. The embedding of DDMI functionality in the cable itself provides enhanced diagnostic monitoring functionality, but also introduces other issues such as increased EMI and cable orientation-related complexity. Solutions to these issues are described in the following disclosure with reference to FIGS. 4A-4C.

FIG. 4A is a block diagram of an AOC diagnostic monitoring system 1700 with embedded DDMI, configured to convey DDMI flags using a single connector pin in accordance with some implementations. In system 1700, the transceiver engine 1422 of transceiver module A (1416) receives optical signals at detector 1422*b* as described above, and photo current output monitor circuitry 1423 outputs optical power monitoring current $I_{MON}$ as described above. Rather than conveying monitoring current $I_{MON}$ to the DFP 1412 for further processing, however, transceiver engine 1422 conveys the monitoring current $I_{MON}$ to an embedded DDMI 1720 included in the transceiver module of the cable.

The embedded DDMI 1720 includes a current-to-voltage converter (e.g., resistor) 1706, which converts the monitoring current $I_{MON}$ to a voltage, and an A/D converter 1702, which converts the analog voltage to a digital signal to be processed by microcontroller 1704. Microcontroller 1704 is configured to (e.g., by settings in a register map) receive the digital signal, compare it to one or more thresholds, and output a flag if a signal violates a threshold (e.g., is beneath a minimum threshold or above a maximum threshold). Stated another way, if the optical power monitoring current $I_{MON}$ is high enough or low enough to indicate a quality issue with the AOC (e.g., a bad fiber, a faulty laser detector, and so forth), then microcontroller 1704 transmits a flag to the DFP 1412. The flag may be conveyed to the DFP 1412 using a sideband channel (e.g., SBU1) or any other available channel. As described above, in alternative implementations, the monitoring current $I_{MON}$ may processed by microcontroller 1704 without being first converted to a voltage and/or without being converted to a digital signal.

Since DDMI 1720 is embedded in the AOC, DDMI 1720 may have direct access to additional monitoring data. In some implementations, DDMI 1720 includes diagnostic monitor circuitry 1708 configured to receive signals corresponding to receiving circuitry power (RX power), transmission circuitry power (TX power), transceiver engine bias current, local supply voltage, local temperature, and/or soft controls. The diagnostic monitor circuitry 1708 may additionally monitor ingress optical power via monitoring current $I_{MON}$. In some implementations, diagnostic monitor circuitry 1708 includes $I_{MON}$ processing circuitry (e.g., A/D converter 1702 and/or current-to-voltage converter 1706). Diagnostic monitor circuitry 1708 conveys the received signals to microcontroller 1704, which is configured to compare each respective signal to corresponding thresholds, and transmit flags to DFP 1412 in the event one or more of the thresholds are violated.

The diagnostic monitor circuitry 1708 includes (or is otherwise associated with) clock circuitry 1710, comprising digital clock circuits and/or one or more oscillators. The clock circuitry 1710 generates one or more clock signals that synchronize the data processing functions of the monitor circuitry 1708 (e.g., the receiving, processing, and transmitting of the diagnostic data). Therefore, operation of the clock circuitry 1710 is necessary for the operation of diagnostic monitor circuitry 1708, and as an extension, necessary for the operation of DDMI 1720.

In some implementations, the embedded DDMI 1720 (specifically, the diagnostic monitor circuitry 1708) may be a source of EMI during operation of devices connected to the AOC (e.g., DFP 1412 and/or UFP 1452). For example, for imaging devices connected to the AOC, the increased EMI caused by DDMI 1720 may cause image artifacts during operation of the imaging device. Thus, it may be advantageous to disable the embedded DDMI 1720 during certain noise-sensitive operations involving the AOC. As such, in some implementations, microcontroller 1704 may be configured to transmit a clock disable signal (CLK Disable) to the clock circuitry 1710 to disable one or more digital clocks and/or one or more oscillators of the clock circuitry 1710, thereby ceasing operating the diagnostic monitor circuitry 1708. This may be in response to receiving a clock disabling instruction from an external device (e.g., DFP 1412). The external device may send such an instruction while performing noise-sensitive operations.

In some implementations, the instruction to disable DDMI clock circuitry 1710 may be sent via a dedicated pin (not shown), or via two sideband pins using I2C (as described below with reference to FIGS. 4B-4C). As such, to disable the DDMI circuitry, an application in the external device may send an instruction or command (e.g., via I2C) that controls an ON or OFF state of the clock circuitry 1710. Such an instruction or command would disable all clocks associated with the diagnostic monitoring circuit 1708. In some implementations, the clock circuitry 1710 may also be responsible for running microcontroller 1704 (e.g., initiating and synchronizing operations involving the microcontroller) or the microcontroller 1704 may include its own clock circuitry. In such implementations, additional circuitry in DDMI 1720 (not shown) may be configured to disable the clock circuitry 1710 (or the clock circuitry of the microcontroller 1704) for a predefined period (e.g., until the expiration of a timed delay). As such, an unresponsive microcontroller (as a result of clock circuitry 1710 or its own clock circuitry being disabled) would not impede the clock circuitry 1710 from turning back on, since the additional circuitry would wake up the clock circuitry 1710 at the end of the predefined period. In some implementations, at the end of the predefined period, the additional circuitry may be configured to enable, or re-enable, the clock circuitry 1710.

FIG. 4B is a block diagram of an AOC diagnostic monitoring system 1713 with embedded DDMI, configured to convey DDMI data using two connector pins implementing I2C in an orientation-agnostic manner in accordance with some implementations. System 1713 corresponds to system 1700, with the addition of an I2C bus implemented between the embedded DDMI 1720 (specifically, microcontroller 1704 of DDMI 1720) and DFP 1412 via two sideband channels SBU1 and SBU2. I2C requires two channels (sometimes referred to as lines) to communicate-a clock channel (SCL) and a data channel (SDA). Microcontroller 1704 may communicate with DFP 1412 by using one sideband channel for SCL and the other sideband channel for SDA. In order to determine which sideband channel corresponds to SCL and which sideband channel corresponds to SDA, DFP 1412 may sense the orientation of the AOC (e.g., by sensing for presence of resistor Ra as described above with reference to FIG. 1) to determine which channel is the configuration channel CC and which channel is the internal connector power channel VCONN, thereby providing orientation information, from which the position of the two sideband channels SBU1 and SBU2 may be ascertained (e.g., as depicted in FIG. 2B).

By implementing an I2C bus in the AOC, DFP 1412 may convey embedded messages including clock disable commands (configured to cause microcontroller 1704 to issue a clock disable (CLK Disable) signal to clock circuitry 1710 as described above) and/or embedded messages including orientation sensing determinations (e.g., based on resistor Ra sensing as described above).

In system 1713, microcontroller 1704 is configured to convey SCL and SDA on the same channel regardless of orientation of the AOC with respect to the DFP 1412 receptacle. As such, depending on the ascertained orientation of the two sideband channels carrying SCL and SDA, DFP 1412 would need to be configured to switch which channel is assigned as SCL and which is assigned as SDA. For instance, plugging connector 1414 of the AOC in one orientation with respect to the DFP 1412 receptacle may convey SCL to pin A8 of the DFP 1412 receptacle and SDA to pin B8 of the DFP 1412 receptacle, while plugging connector 1414 of the AOC in the opposite orientation with respect to the DFP 1412 receptacle may convey SCL to pin B8 (instead of A8) of the DFP 1412 receptacle and SDA to pin A8 (instead of B8) of the DFP 1412 receptacle. As such, the I2C circuitry in DFP 1412 would be required to determine the orientation of connector 1414 and then treat the sideband pins accordingly (by assigning each to SCL and SDA, or vice versa). FIG. 4C, on the other hand, describes an implementation in which microcontroller 1704 always conveys SCL and SDA to the same pins of DFP 1412, regardless of orientation of connector 1414.

FIG. 4C is a block diagram of an AOC diagnostic monitoring system 1740 with embedded DDMI, configured to convey DDMI data using two connector pins implementing I2C in an orientation-specific manner in accordance with some implementations. System 1740 corresponds to system 1713, with the addition of a multiplexer 1712 configured to select which of two I2C buses provided by microcontroller 1704 to convey to an external device via connector 1414. As a result, the plug pins of the AOC (e.g., sideband pins SBU1 and SBU2 in connector 1414) always convey SCL and SDA to the same receptacle pins of the external device, regardless of the orientation of the plug with respect to the receptacle. As depicted in FIG. 4C, the SBU1 pin in DFP 1412 is always assigned to SDA, and the SBU2 pin in DFP 1412 is always assigned to SCL, regardless of the orientation of the SBU1 and SBU2 pins in connector 1414 of the AOC. Alternatively, the SBU1 pin in DFP 1412 may always assigned to SCL, and the SBU2 pin in DFP 1412 may always be assigned to SDA, regardless of the orientation of the SBU1 and SBU2 pins in connector 1414 of the AOC. In order to provide the same clock or data channel to the same pin of the receptacle regardless of plug orientation, microcontroller 1704 determines the orientation of the plug with respect to the receptacle, and assigns pins SBU1 and SBU2 to one of two I2C buses using multiplexer 1712, wherein a first of the two I2C buses (I2C-1) is configured with SCL on a first line and SDA on a second line, and a second of the two I2C buses (I2C-2) is configured with SDA on a first line and SCL on a second line (the opposite configuration of I2C-1). As such, multiplexer 1712 always presents SCL and SDA to the external device in the correct order, regardless of the orientation of the plug with respect to the receptacle of the external device. Stated another way, microcontroller 1704 and multiplexer 1712 configures the pinout of connector 1414 based on the orientation of connector 1414 with respect to the receptacle in which connector 1414 is plugged.

FIGS. 5A-5B are block diagrams depicting the multiplexing circuitry 1712 and corresponding orientation-based I2C output configuration examples in more detail in accordance with some implementations.

The DFP 1412 receptacle in both FIGS. 5A and 5B includes two pins configured for I2C communications, with pin A8 (corresponding to one of two sideband channels) assigned to SDA, and pin B8 (corresponding to the other of two sideband channels), assigned to SCL. For implementations in which the receptacle is a USB-C receptacle, FIG. 2A depicts more details regarding the physical layout of these two pins.

The cable plug (connector) 1414 in both FIGS. 5A and 5B includes two pins configured for I2C communications, with pin A8 (corresponding to one of two sideband channels) assigned to either SDA or SCL, and pin B8 (corresponding to the other of two sideband channels), assigned to SCL or SDA. For implementations in which the plug is a USB-C plug, FIG. 2B depicts more details regarding the physical layout of these two pins.

In FIG. 5A, connector 1414 is plugged into DFP 1412 receptacle in a first orientation, such that receptacle pin A8 (SDA) lines up with plug pin A8, and receptacle pin B8 (SCL) lines up with plug pin B8. As such, multiplexer 1712 presents the first I2C bus (I2C-1) to connector 1414, so that the SDA line at plug pin A8 is presented to the SDA line assigned to receptacle pin A8, and the SCL line at plug pin B8 is presented to the SCL line assigned to receptacle pin B8.

In FIG. 5B, connector 1414 is plugged into DFP 1412 receptacle in a second orientation opposite the first orientation, such that receptacle pin A8 (SDA) lines up with plug pin B8, and receptacle pin B8 (SCL) lines up with plug pin A8. As such, multiplexer 1712 presents the second I2C bus (I2C-2) to connector 1414, so that the SDA line at plug pin B8 is presented to the SDA line assigned to receptacle pin A8, and the SCL line at plug pin A8 is presented to the SCL line assigned to receptacle pin B8.

Thus, regardless of the orientation of the plug with respect to the receptacle, the receptacle always interfaces with the same I2C signals coming from the plug. Specifically, receptacle pin A8 always interfaces with the SDA channel in the cable, and receptacle pin B8 always interfaces with the SCL channel in the cable, due to the SDA channel being presented on plug pin A8 or B8 (according to plug orientation) and the SCL channel being presented on plug pin B8 or A8 (according to plug orientation).

As a result of DFP 1412 receiving the same I2C channels regardless of plug orientation, the DFP 1412 does not require complicated circuitry configured to internally reassign SDA and SCL channels, thereby allowing for plugs using the orientation-based I2C output configuration described herein to be able to interface with external devices that do not have specialized I2C channel switching circuitry.

In the examples described with respect to FIGS. 5A and 5B, microcontroller 1704 first determines the orientation of the plug with respect to the receptacle using orientation detection module 1804, and then controls multiplexer 1712 to present one of the two I2C buses according to the determined orientation as described above, using multiplexer control signal MUX Ctrl to control the internal switching circuitry of the multiplexer 1712 as depicted in the figures.

Orientation detection module 1804 may determine the plug orientation in a variety of ways. As described above with reference to FIG. 1, A DFP 1412 (such as a host computer) exposes pull-up terminations Rp on its CC and VCONN pins. A UFP 1452 (such as a peripheral), exposes pull-down terminations Rd on its CC and VCONN pins. The purpose of Rp and Rd terminations on CC pins is to identify the DFP to UFP connection and the CC pin that will be used for communication (i.e., differentiate between the CC and VCONN pins). To do this, the DFP monitors both CC pins (CC1 & CC2) for a voltage lower than its unterminated voltage.

The cable exposes a pull-down termination, Ra, on its VCONN pin to signal to the DFP that it needs power. The DFP must be able to differentiate between the presence of Rd and Ra to know whether there is a UFP attached and where to apply VCONN. One issue with this detection method is that the method detects cable orientation (e.g., which end is plugged into the DFP 1412 and which end is plugged into the UFP 1452), but the method does not detect orientation of the plug into the receptacle, because while the receptacle may be universal, the cable or plug is not (as depicted in FIG. 2B).

As such, in some implementations, orientation detection module 1804 may determine the plug orientation by sensing different pull-up resistances on the SDA and SCL lines. For example, the SCL line in DFP 1412 can use a pullup resistor having a first resistance (e.g., 4 kOhm), and the SDA line in DFP 1412 can use a pull-up resistor having a second resistance different from the first (e.g., 6 kOhm). Microcontroller 1704 may monitor the SDA and SCL lines to sense the condition of the receptacle based on the different pull-up resistances, and place the internal SDA and SCL signals on the correct pins of connector 1414 as described above.

Additionally or alternatively, orientation detection module 1805 may determine the plug orientation by receiving an I2C wakeup command (e.g., 0xFF) from DFP 1412 (as the cable is an I2C slave device and the DFP 1412 is an I2C master device), at which point microcontroller 1704 analyzes the wakeup command to determine which pin is SCL and which pin is SDA (e.g., by analyzing each pin to see which is more likely to be a clock signal and/or which is more likely to be a data signal). Upon determining which pin is SDA and SCL, microcontroller 1704 places the internal SDA and SCL signals on the correct pins of connector 1414 as described above.

Additionally or alternatively, orientation detection module 1805 may determine the plug orientation by performing VCONN Ra sensing as described above, or receiving an embedded I2C message from DFP 1412 corresponding to a VCONN Ra sensing result as described above (e.g., describing which line is CC and which line is VCONN), and placing the internal SDA and SCL signals on the correct pins of connector 1414 as described above.

The examples described above with reference to FIGS. 14-5B refer to connector (plug and receptacle) pins conforming to the USB-C standard. However, references to USB-C are meant to illustrate the concepts relating to the EMI and orientation-based solutions to various issues that arise from embedding DDMI functionality in an AOC. Other types of cable and connector pinouts and standards apply equally, as long as there is at least one power channel, at least one high-speed data channel, and, in some implementations, at least one sideband channel.

Thus, in some implementations, a diagnostic monitoring device comprises a diagnostic monitor circuit (1708) configured to monitor analog diagnostic monitoring information (e.g., the listed monitoring types in FIGS. 4A-4C), and configured to convert the analog diagnostic monitoring information to digital diagnostic monitoring information, the diagnostic monitor circuit comprising a first clock or a first oscillator (1710); a microcontroller (1704) comprising a register map, wherein the microcontroller is configured to receive the digital diagnostic monitoring information, store the digital diagnostic monitoring information in the register map, and provide a clock disable command (CLK Disable) to the diagnostic monitor circuit; wherein the microcontroller further comprises a communications link for communicating with an external system external to the diagnostic monitoring device. The communications link may be a wired communications link, or it may be a wireless communications link as discussed below. In implementation where the link is a wired communications link, it may be a bus (e.g., a two pin bus such as I2C in FIG. 4B, or I2C-1 and I2C-2 in FIG. 4C). Alternatively, the wired communications link may be a one-pin bus, such as a UART bus.

In some implementations, the diagnostic monitor circuit may be configured to receive a clock disable command from the microcontroller, and in response to receiving the clock disable command, the diagnostic monitor circuit being configured to disable the first clock or the first oscillator. In some implementations, the clock disable command is a clock disable signal. In some implementations, the diagnostic monitoring circuit is further configured to receive a clock enable command, the clock enable command configured to enable the first clock or the first oscillator. In some implementations, the microcontroller further comprises a second clock and wherein the clock disable command is further configured to disable the second clock. In some implementations, the clock disable command is further configured to re-enable the second clock after the expiration of a timed delay, without receiving a separate clock enable command. In some implementations, the clock disable command is a message received from the external system via the bus. In some implementations, the analog diagnostic monitoring information comprises at least one of receiving power, transmitting power, BIAS current, supply voltage, temperature, ingress optical power monitoring, and soft controls.

In some implementations, any or all of the communications that are described herein as occurring over a communications link may occur over a wireless communications link. Such a wireless communications link may receive or transmit communications either in addition to, or instead of, a wired communications link such as a bus. The wireless communications link may in some implementations communicate over the Bluetooth protocol, or may use other short, medium, or long distance wireless protocols, which may include 802.11 wireless networks known as "wi-fi."

In some implementations, programming or reprogramming of microcontroller 1704 may occur over the communications link. In some implementations, such reprogramming may include firmware updates, e.g. to the microcontroller 1704 or to other components of DDMI 1720.

In some implementations, a diagnostic monitoring device comprises a diagnostic monitor circuit (1708) configured to monitor one or more electrical characteristics of an associated device based on diagnostic monitoring information received at the diagnostic monitor circuit (e.g., the listed monitoring types in FIGS. 4A-4C), the diagnostic monitor circuit comprising a first clock or a first oscillator (1710); and a microcontroller (1704) configured to receive processed diagnostic monitoring information from the diagnostic monitor circuit and provide a clock disable signal to the diagnostic monitor circuit, the microcontroller comprising a second clock, wherein the diagnostic monitor circuit is configured to receive a clock disable command (CLK Disable), and disable one or more of the first clock, the first oscillator, and the second clock based on the clock disable command.

In some implementations, a transceiver module (1416) comprises a diagnostic monitor circuit (1710) configured to monitor one or more electrical characteristics based on diagnostic monitoring information received at the diagnostic monitor circuit (e.g., the listed monitoring types in FIGS. 4A-4C); a microcontroller (1710) comprising a register map, wherein the microcontroller is configured to receive the diagnostic monitoring information, wherein the microcontroller further comprises a first internal bus (I2C-1) and a second internal bus (I2C-2), wherein the first internal bus and the second internal bus have opposite orientations (e.g., one bus assigns SDA to a first line and SCL to a second line, and the other bus assigns SCL to a first line and SDA to a second line); a connector (1414, 1504) configured to be coupled to the external system via a receptacle (1502) capable of receiving the connector in more than one orientation, the connector having a first pin in a first row of pins (A8), and a second pin in a second row of pins (B8), the second row of pins being opposite the first row of pins, the first pin being located a number of pins away from the beginning of the first row (e.g., eight pins away from A1), and the second pin being located the same number of pins away from the beginning of the second row (e.g., eight pins away from B1), wherein the beginning of the first row (e.g., A1) and the beginning of the second row (e.g., B1) are on opposite ends of the connector; an external bus coupled to the connector (SDA and SCL in DFP 1412 in FIGS. 4C and 5A-5B); an orientation detection module (1804), configured to detect whether the data information is being received on the first pin or the second pin (e.g., based on a detected orientation of the connector with respect to the receptacle); activate the first internal bus if the data information is being received on the first pin (e.g., convey one of I2C-1 or I2C-2 to the connector via multiplexer 1712); activate the second internal bus if the data information is being received on the second pin (e.g., convey the other of I2C-1 or I2C-2 to the connector via multiplexer 1712); and operationally couple the activated first internal bus or the activated second internal bus to the external bus (via multiplexer 1712 and connector 1414).

In some implementations, the connector is a USB type C connector. In some implementations, the orientation detection module is configured to detect whether the data information is being received on the first pin or the second pin by measuring a first resistance of a first pin signal received on the first pin (pull-up resistor of one of the clock line or the data line in DFP 1412) and measuring a second resistance of a second pin signal received on the second pin (pull-up resistor of the other of the clock line or the data line in DFP 1412), and determining whether the first resistance or the second resistance matches a data pin resistance (or whether the first resistance is greater than or less than the second resistance, or whether the first resistance meets or does not meet a threshold associated with the corresponding pull-up resistor for the particular clock line or data line). In some implementations, the orientation detection module is configured to detect whether the data information is being received on the first pin or the second pin by determining which pin in the first row of pins or the second row of pins received a wakeup command (e.g., an I2C wakeup command).

Figure 6:
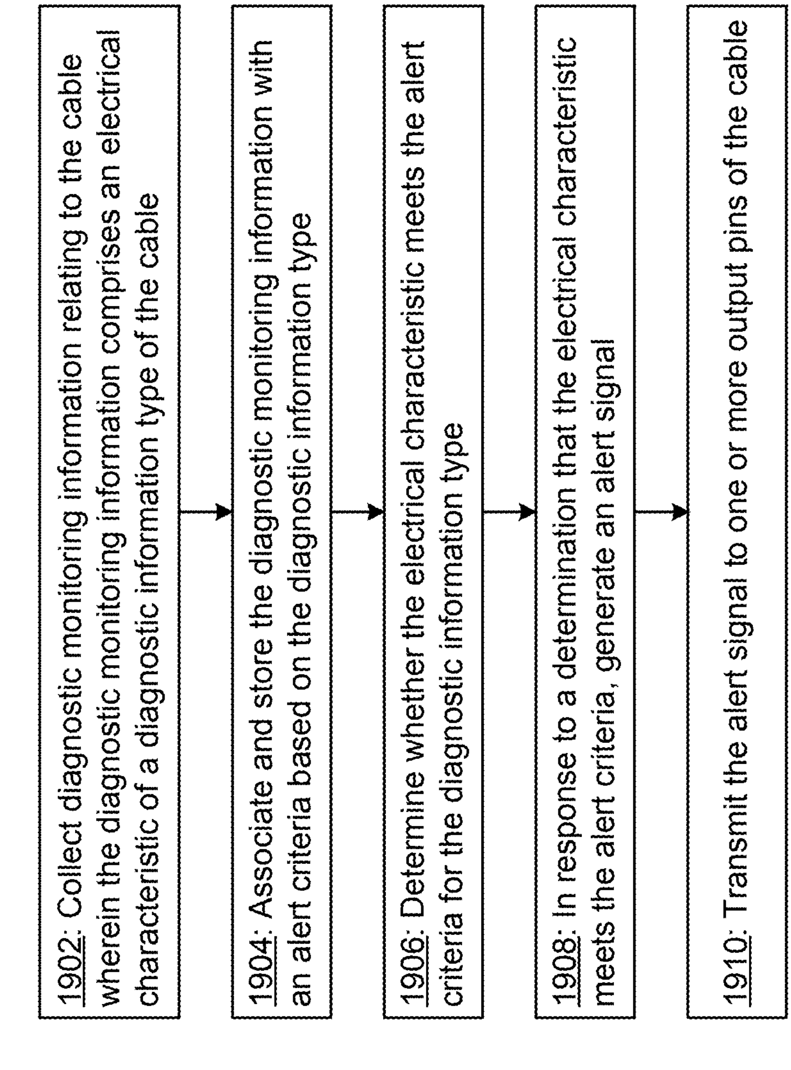
FIG. 6 is a flow chart in accordance with one aspect of the present disclosure.

Turning now to FIG. 6, a flow chart of a process whereby the cable can engage in statistical analysis to cable failure and generate alerts or warnings, is shown. As discussed with reference to FIGS. 4A through 4C, a diagnostic monitoring device e.g. diagnostic monitoring system 1700, 1713, and/or 1740, may be configured to collect (1902) diagnostic monitoring information relating to the cable. In some embodiments, the diagnostic monitoring device may include one or more diagnostic monitoring sensors to collect diagnostic monitoring information. Examples of diagnostic monitoring sensors may include current sensors, voltage sensors, inertial measurement devices, accelerometers, gyroscopes, etc. Diagnostic monitoring information may be information that describes an electrical characteristic of a particular operation parameter of the cable. Examples of electrical characteristics may include laser current, laser voltage, ingress optical power, local transmitted and received power, local BIAS current, local supply voltage, local temperature, and also allows for other soft controls.

In some embodiments, the electrical characteristic has a numerical value, and may be stored along with its type. A temperature value can be stored, for example, along with information indicating that that value is a temperature value.

In some embodiments, the cable may associate and store (1904) the diagnostic monitoring information with an alert criteria based on the diagnostic information type. For example, alerts may be generated if the age of the cable exceeds a certain value, or if the temperature of the cable either exceeds a certain value or goes below a different value.

The diagnostic monitoring device may be configured to then, as it collects electrical characteristic data of a given type, determine (1906) whether the electrical characteristic meets the alert criteria for that diagnostic information type. In response to a determination that the electrical characteristic meets the alert criteria, the diagnostic monitoring device may, in some embodiments, generate (1908) an alert signal and transmit (1910) the alert signal to one or more output pins of the cable.

The alert criteria may be a rules based system or a machine learning based system. In a rules based system, the diagnostic monitoring device of the cable collects the data relating to cable health as part of the enhanced DDMI. As discussed above, cable data can include laser current, laser voltage, Rx Power, Tx Power, Bias Current, Supply Voltage, Temperature, and Soft Controls. Data may also include cable age, or derivatives thereof such as date first deployed. Data may also include cable run time, or derivatives thereof such as cable age minus a tracked amount of time during which the cable was down, or not running. The rules based system may also include rules by which the system performs statistical modeling and analysis. These rules can be updated from time to time, either from data relating to the cable itself, or from data relating to similar cables, which can be stored, e.g., in a cloud based database.

The rules in a rules based system can be applied to determine whether the collected data meets a rule that merits an alert, e.g., that cable failure is imminent based on the statistical analysis of the data from this cable and others like it in the field, either past or present. In some embodiments, decision rules may be based on known statistical processing rules (like Western Electric rules) or intuitive knowledge. In some embodiments, the rules may also be applied to determine whether the collected data merits a warning, that failure is not imminent but that the cable may be within some preferred threshold likelihood of failure. This might assist the owner or user of the cable in knowing when to acquire, and then when to deploy, a substitute cable. In some embodiments, the cable may contain an accelerometer. Data from this accelerometer can be stored on the cable and/or in an off cable database, alongside the other cable data discussed above. Accelerometer data may correlate to physical wear and tear on the cable, as it can inform the statistical analysis of how often and for how long the cable was stressed on account of it being in motion, or twisted, or bent.

If a rule that merits a cable failure alert is met, an alert can be sent, e.g. over the cable, via the cable's connector, to a downstream or upstream device. If a rule that merits a warning is met, a warning can be sent. In some embodiments, multiple warnings, if in existence simultaneously for the same cable, may themselves trigger an imminent failure alert even though no single statistic triggers a failure alert. If no alerts or warnings are merited, the statistical analysis returns the result that the cable is working as designed, and in some embodiments may remain dormant until new statistics are collected or rules are updated.

It would be useful in some embodiments to have dynamically updating statistical modeling to alert or warn users of imminent or anticipated cable failure. In such embodiments, a machine learning system may be used. An exemplary machine learning system and process is described in further detail below.

Figure 7A:
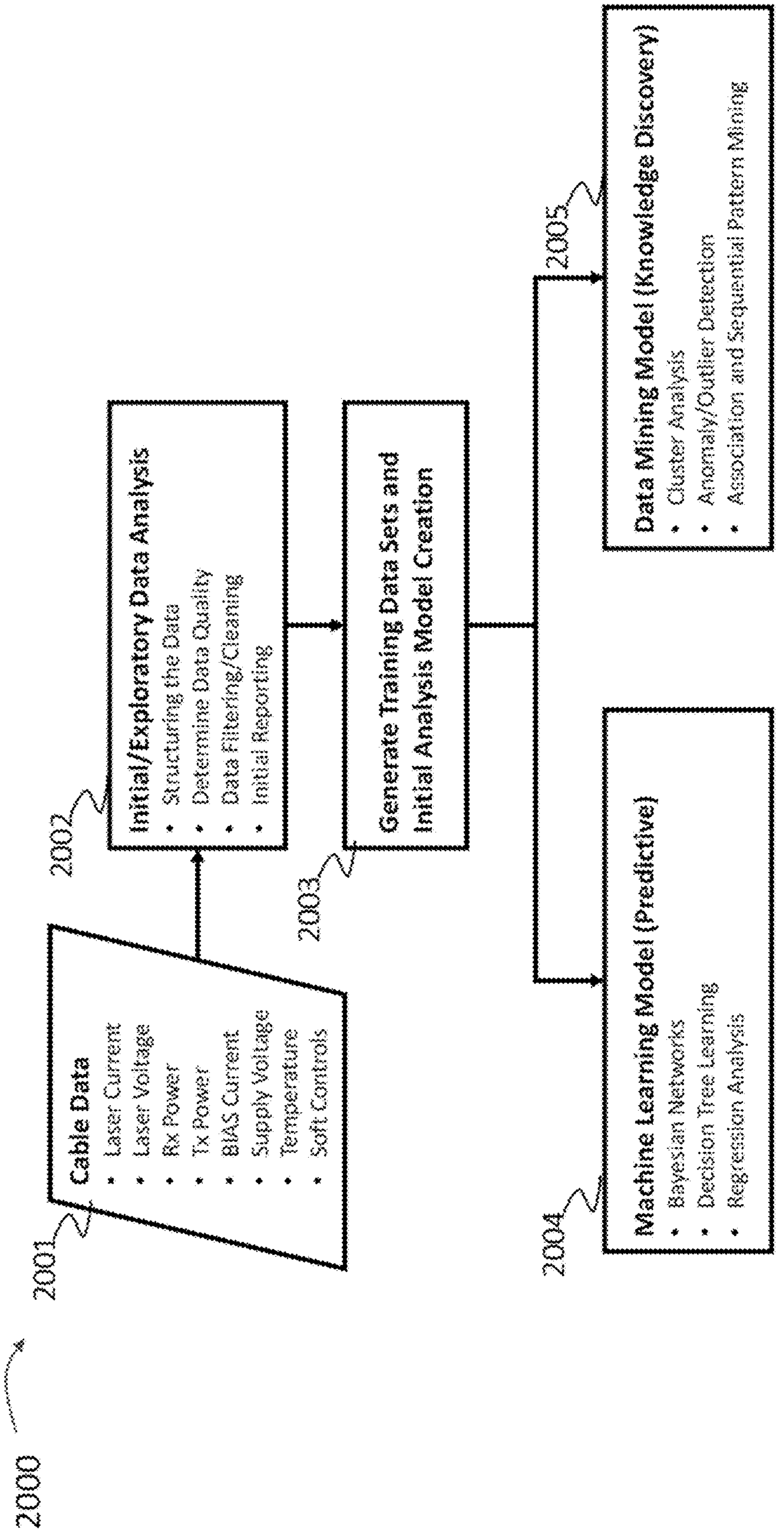
FIGS. 7A and 7B are flow charts in accordance with one aspect of the present disclosure.

Turning now to FIG. 7A, where a flow chart of a process 2000 for a machine learning model of statistical analysis is shown in accordance with one aspect of the present disclosure. FIG. 7A is a flow chart of initial data analysis in a machine learning based system of statistical analysis.

When a cable is first deployed, an initial set of cable data is collected (2001) via the Enhanced DDMI processes discussed herein. As noted previously, this data can include laser current, laser voltage, Rx power, Tx power, BIAS current, supply voltage, temperature, or soft controls. Other diagnostic information could also be collected and monitored as discussed.

Initial exploratory data analysis is performed (2002) on the initial set of cable data, including structuring the data, determining the data quality, filtering and cleaning (or removing) the data indicative of repetitive or erroneous data. An initial preliminary statistical report will be generated.

A training data set may be generated (2003) based on the initial or exploratory data analysis. Each training data set may be representative of cable diagnostic data or one or more electrical characteristics (as described herein) of the cable.

In some embodiments, a machine learning model may be created (2004) based on the initial or exploratory data analysis and the training data set. In some embodiments a machine learning model may be as a predictive model for each individual cable. This model may use Bayesian Networks, Decision Tree Learning, and other regression analyses to predict failures for a specific cable. Other predictive analysis may also be used, in addition to or instead of those listed.

In some embodiments, a data mining (knowledge discovery model may be created (2005) based on the initial or exploratory data analysis. In some embodiments, a data mining model may be a universal knowledge discovery model for all cables in the field. A data mining model may use cluster analysis, anomaly/outlier detection algorithms, and association and sequential pattern mining to better understand universal trends amongst deployed cables. Other data analysis techniques can also be used. The collected cable diagnostic data, as well as other data (specific customer, application, etc.) may be used to generate the models described herein.

Figure 7B:
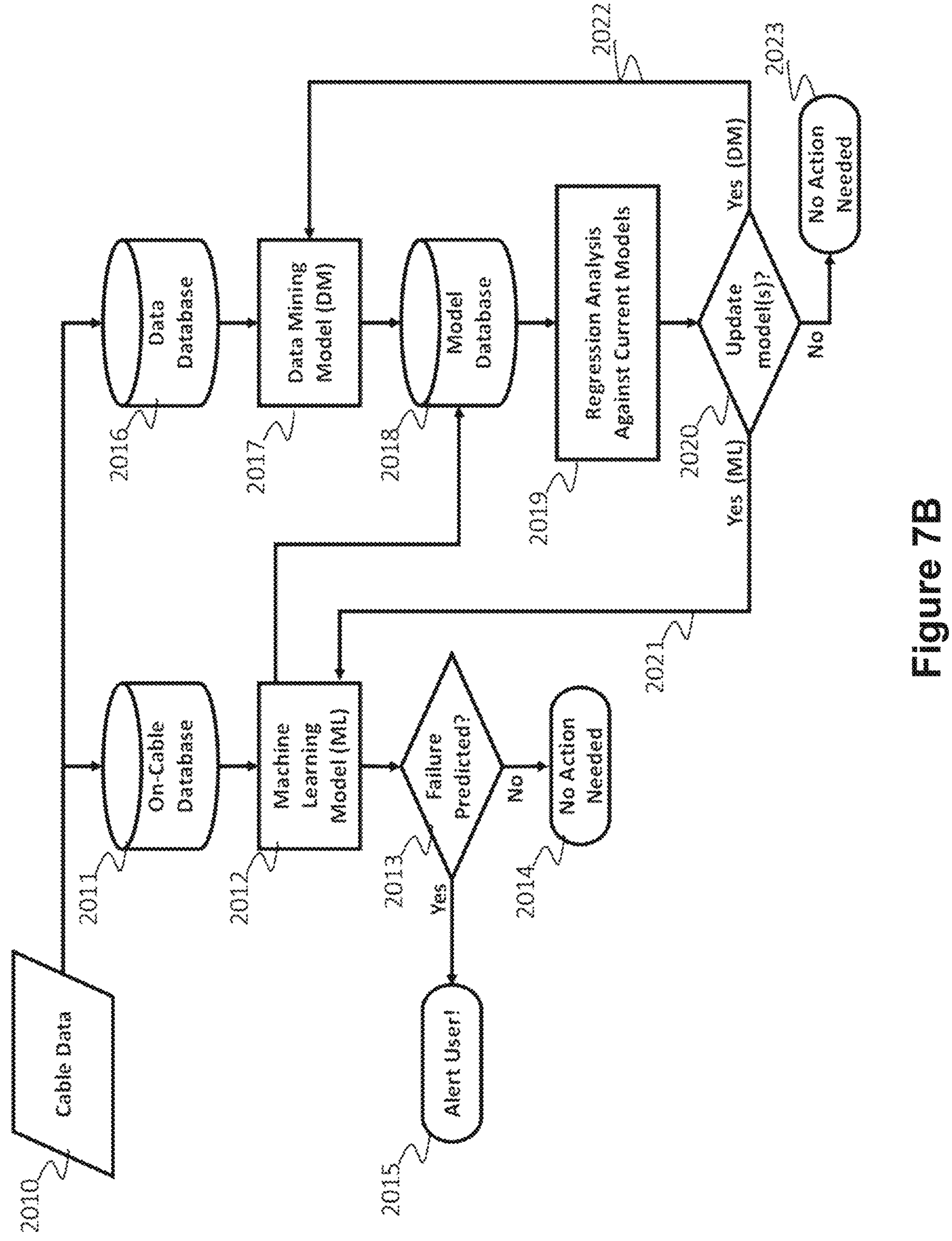

Turning now to FIG. 7B, a flow chart for ongoing statistical analysis is shown in accordance with one aspect of the present disclosure. After the initial/exploratory data analysis phase is finished, e.g. the initial exploratory data analysis phase as discussed with reference to FIG. 7A, and an initial machine learning model is established as in step 2004 or 2005 of FIG. 7A, the individual cable data may continue to be collected (2010). The cable data may be saved (2011) on a repository or database on the cable, in an on-cable database. The machine learning model may analyze (2012) the data, e.g. to aid in predicting a cable failure (2013) and alert (2015) the user if action is needed or end (2014) the analysis with no action needed. The on cable database is updated as monitoring continues to happen over time and, based on the new data, the model can also be updated.

If available, the data will also be sent to a universal cloud-based data database (2016), with which the cable may communicate via a communications link, which may be within the cable. The cloud based data database will, in some embodiments, house information on cables, past or present, in the field. In some aspects, the data database may contain age related data relating to the cable, including the date the cable was first deployed, and may also contain the total run time of the cable which can be gathered, e.g., by subtracting from the age of the cable an amount of time during which clock signals on the cable were not running. The data may also include data from an accelerometer embedded into the cable, which can be used to measure direct wear and tear on the cable based on how much and what kinds of movements and force have been applied to it during its life.

The data mining model may be used (2017) to identify universal trends against other relevant AOX cables.

The data mining model (1607) may also automatically be updated, as needed, based on new cable data.

From time to time at set or variable intervals, each individual cable's machine learning model will be sent to a model database (2018). For clarification, the model database receives updates to the data mining model, as opposed to updates to the monitoring data itself.

Using regression analysis and/or alternative data mining models (2019), each individual cable's model will be compared against other cable's models and the data mining models to determine if the individual cable's model is the optimal model for the cable, or if it needs to be updated (2020) in response to new diagnostic monitoring information. If there is a more optimal model, the new machine learning model can be downloaded (2021) to the cable. Accordingly, in some embodiments, future analysis of diagnostic monitoring data will issue alerts, if cable failure is predicted, in accordance with the updated machine learning model. Additionally, the data mining model may be updated (2022) accordingly. If there is not a better model, the process ends (2023) with no action needed.

Having described a number of embodiments above, it should be appreciated that a heretofore unseen opto-electronic contact, associated method and connection system have been brought to light by the present disclosure. Such a contact can include an active opto-electronic converter including a converter length extending between opposing first and second ends to define a converter axis having the first end configured for removable optical engagement with an opposing contact. A housing such as, for example, a barrel housing can define an interior cavity having an elongated length extending between opposing first and second barrel openings to define an elongation axis and having the opto-electronic converter captured in the interior cavity for external optical engagement to the opposing contact via the first barrel opening for relative movement of the converter axis along the elongation axis, transverse thereto, and oblique thereto to accommodate mating tolerances responsive to engaging the opposing contact. In an embodiment, a flexible circuit board assembly includes an internal electrical connection end, an external electrical connection end and an elongated length extending therebetween. The internal connection end electrically engages the converter and the external connection end can be fixedly positioned proximate to the second barrel opening for external electrical connection to the opto-electronic contact such that the external connection end is positioned on the elongation axis at a distance from the second end of the opto-electronic contact that is less than the elongated length of the flexible circuit board and the elongated length is captured within the interior cavity of the barrel housing.

The foregoing description has been presented for purposes of illustration and description. Accordingly, the present application is not intended to be exhaustive or to limit the invention to the precise form or forms disclosed, and other embodiments, modifications and variations may be possible in light of the above teachings wherein those of skill in the art will recognize certain modifications, permutations, additions and sub-combinations thereof.

What is claimed is:

1. A diagnostic monitoring device comprising:

a diagnostic monitor circuit within a cable, and configured to monitor analog diagnostic monitoring information, and configured to convert the analog diagnostic monitoring information to digital diagnostic monitoring information, the diagnostic monitor circuit comprising a first clock or a first oscillator;

a microcontroller within the cable, and comprising a register map, wherein the microcontroller is configured to:

receive the digital diagnostic monitoring information;

store the digital diagnostic monitoring information in the register map;

generate a clock disable command in response to an instruction received from an external system; and transmit the clock disable command to the diagnostic monitor circuit;

wherein the microcontroller further comprises a communications link for communicating with the external system external to the diagnostic monitoring device;

wherein the diagnostic monitor circuit is configured to receive a clock disable command from the microcontroller, and in response to receiving the clock disable command, the diagnostic monitor circuit being configured to disable the first clock or the first oscillator for at least a predefined period of time, thereby ceasing operation of the diagnostic monitor circuit.

2. The diagnostic monitoring device of claim 1, wherein the clock disable command is a clock disable signal.

3. The diagnostic monitoring device of claim 2, wherein the diagnostic monitoring circuit is further configured to receive a clock enable command, the clock enable command configured to enable the first clock or the first oscillator.

4. The diagnostic monitoring device of claim 3, wherein the microcontroller further comprises a second clock and wherein the clock disable command is further configured to disable the second clock.

5. The diagnostic monitoring device of claim 4, wherein, in accordance with the clock disable command, the second clock is re-enabled after a pre-defined timed delay, without receiving a separate clock enable command.

6. The diagnostic monitoring device of claim 1, wherein the instruction received from the external system via the communications link is to disable the first clock of the diagnostic monitor circuit.

7. The diagnostic monitoring device of claim 1, wherein the analog diagnostic monitoring information comprises at least one of receiving power, transmitting power, BIAS current, supply voltage, temperature, ingress optical power monitoring, and soft controls.

8. The diagnostic monitoring device of claim 1, wherein the diagnostic monitor circuit is configured to monitor one or more electrical characteristics of an associated device based on diagnostic monitoring information received at the diagnostic monitor circuit.

* * * * *